(12) United States Patent
Wu et al.

(10) Patent No.: US 12,317,448 B2
(45) Date of Patent: May 27, 2025

(54) LIQUID COOLING PLATE AND SERVER

(71) Applicants: INVENTEC (PUDONG) TECHNOLOGY CORPORATION, Shanghai (CN); INVENTEC CORPORATION, Taipei (TW)

(72) Inventors: Jiang-jun Wu, Shanghai (CN); Jingnan Zhao, Shanghai (CN); Peng Yu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 238 days.

(21) Appl. No.: 18/209,694

(22) Filed: Jun. 14, 2023

(65) Prior Publication Data

US 2024/0414879 A1 Dec. 12, 2024

(30) Foreign Application Priority Data

Jun. 8, 2023 (CN) ......................... 202310678317.X

(51) Int. Cl.
*H05K 7/20* (2006.01)

(52) U.S. Cl.
CPC ..... *H05K 7/20254* (2013.01); *H05K 7/20772* (2013.01)

(58) Field of Classification Search
CPC ............ H05K 7/20254; H05K 7/20772; H01L 23/473
See application file for complete search history.

(56) References Cited

U.S. PATENT DOCUMENTS

| | | | | |
|---|---|---|---|---|
| 8,644,021 | B2* | 2/2014 | Chen ................. | H05K 7/20809 361/689 |
| 11,770,914 | B2* | 9/2023 | Adam ................. | H05K 7/2039 361/699 |
| 2009/0205810 | A1* | 8/2009 | Wan .................... | G06F 1/20 165/80.4 |
| 2022/0159868 | A1* | 5/2022 | Huang ............... | H05K 7/20772 |
| 2024/0365507 | A1* | 10/2024 | Li ...................... | H05K 7/20927 |
| 2024/0414890 | A1* | 12/2024 | Wu ..................... | H05K 7/20 |
| 2025/0081391 | A1* | 3/2025 | Zhao ................. | H05K 7/20336 |

* cited by examiner

Primary Examiner — Robert J Hoffberg
(74) Attorney, Agent, or Firm — Maschoff Brennan

(57) ABSTRACT

A liquid cooling plate is configured to be in thermal contact with at least one first heat source and at least one second heat source. The liquid cooling plate includes at least one first heat dissipation part and a second heat dissipation part. The first heat dissipation part is configured to be in thermal contact with the first heat source and has a fluid chamber. The second heat dissipation part is connected to the first heat dissipation part and configured to be in thermal contact with the second heat source. The second heat dissipation part has a fluid channel, and the fluid channel is in fluid communication with the fluid chamber.

6 Claims, 3 Drawing Sheets

LIQUID COOLING PLATE AND SERVER

CROSS-REFERENCE TO RELATED APPLICATIONS

This non-provisional application claims priority under 35 U.S.C. § 119 (a) on Patent Application No(s). 202310678317.X filed in China, on Jun. 8, 2023, the entire contents of which are hereby incorporated by reference.

BACKGROUND OF THE INVENTION

Technical Field of the Invention

The invention relates a liquid cooling plate and a server.

Description of the Related Art

In general, a motherboard of a server not only has a central processing unit (i.e., CPU), but also is provided with a plurality of voltage regulator chips (i.e., VR chips) to adjust loading voltage for the operation of CPU. The CPU is cooled by a cooling plate, and the VR chips are cooled by heat dissipation fins in combination with a passive or active air cooling means. However, as the performances of the VR chips are improved, the VR chips generate more heat, and thus the conventional heat dissipation fins in combination with the passive or active air cooling means are insufficient to effectively and efficiently dissipate heat generated by the VR chips. Therefore, how to solve the aforementioned issue is one of the topics in this field.

SUMMARY OF THE INVENTION

The invention provides a liquid cooling plate and a server which enable the VR chips to be effectively and efficiently cooled.

One embodiment of the invention provides a liquid cooling plate. The liquid cooling plate is configured to be in thermal contact with at least one first heat source and at least one second heat source. The liquid cooling plate includes at least one first heat dissipation part and a second heat dissipation part. The first heat dissipation part is configured to be in thermal contact with the first heat source and has a fluid chamber. The second heat dissipation part is connected to the first heat dissipation part and configured to be in thermal contact with the second heat source. The second heat dissipation part has a fluid channel, and the fluid channel is in fluid communication with the fluid chamber.

Another embodiment of the invention provides a server. The server includes a casing, a motherboard and a liquid cooling plate. The casing has an accommodation space. The motherboard is located in the accommodation space and has at least one first heat source and at least one second heat source. The liquid cooling plate includes at least one first heat dissipation part and a second heat dissipation part. The first heat dissipation part is in thermal contact with the first heat source and has a fluid chamber. The second heat dissipation part is connected to the first heat dissipation part and in thermal contact with the second heat source. The second heat dissipation part has a fluid channel, and the fluid channel is in fluid communication with the fluid chamber.

According to the liquid cooling plate and the server as discussed in the above embodiments, the first heat dissipation part of the liquid cooling plate is in thermal contact with the first heat source, the second heat dissipation part of the liquid cooling plate is connected to the first heat dissipation part and in thermal contact with the second heat source, and the fluid channel of the second heat dissipation part is in fluid communication with the fluid chamber of the first heat dissipation part, such that the coolant in the fluid chamber of the first heat dissipation part can take away the heat generated by the first heat source, and the coolant in the fluid channel of the second heat dissipation part can take away the heat generated by the second heat source. As a result, the liquid cooling plate can effectively and efficiently perform heat dissipation to the first heat source and the second heat source so as to achieve the heat dissipation requirements of the first heat source and the second heat source.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
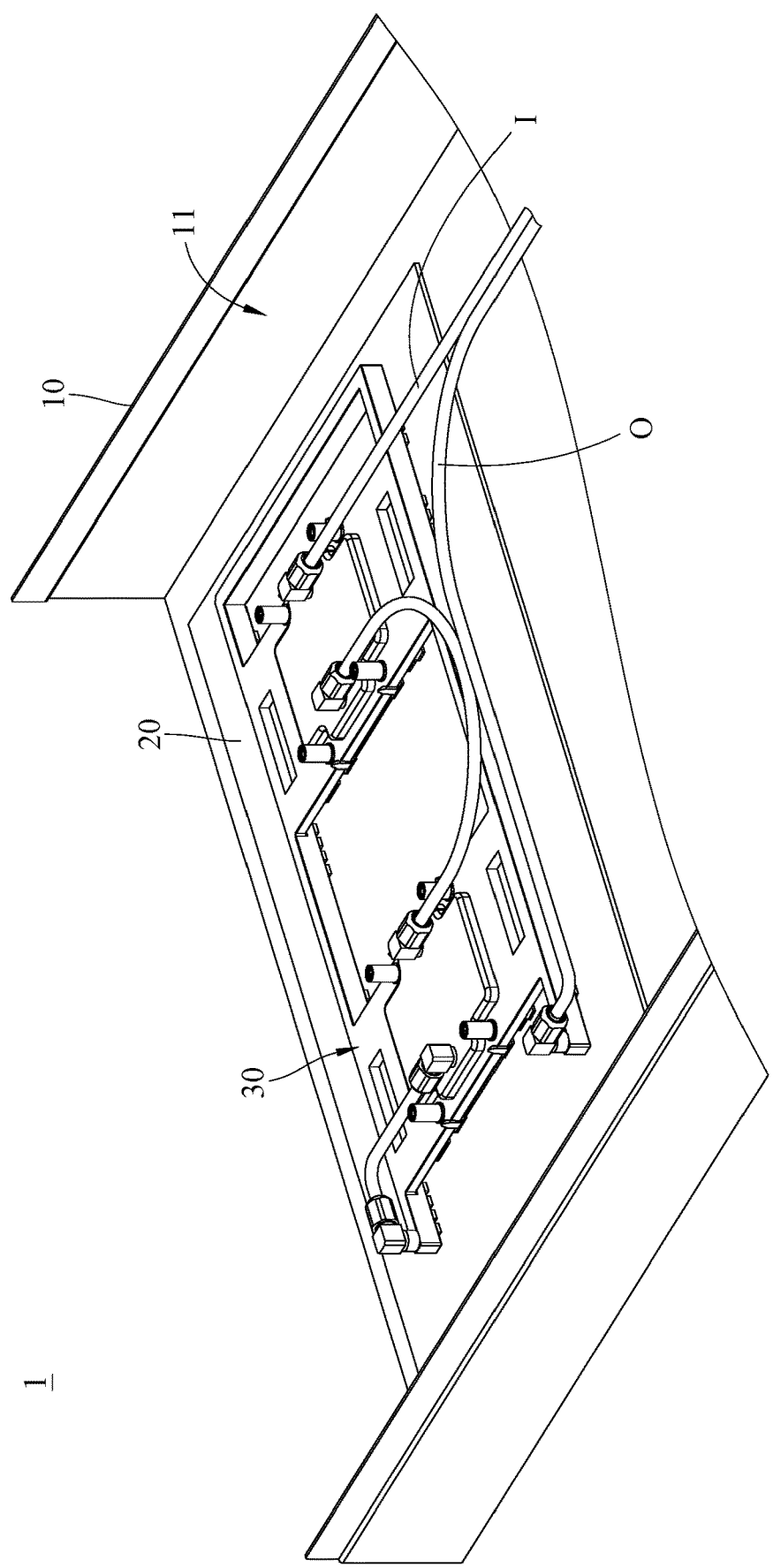
FIG. 1 is a partial perspective view of a server according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
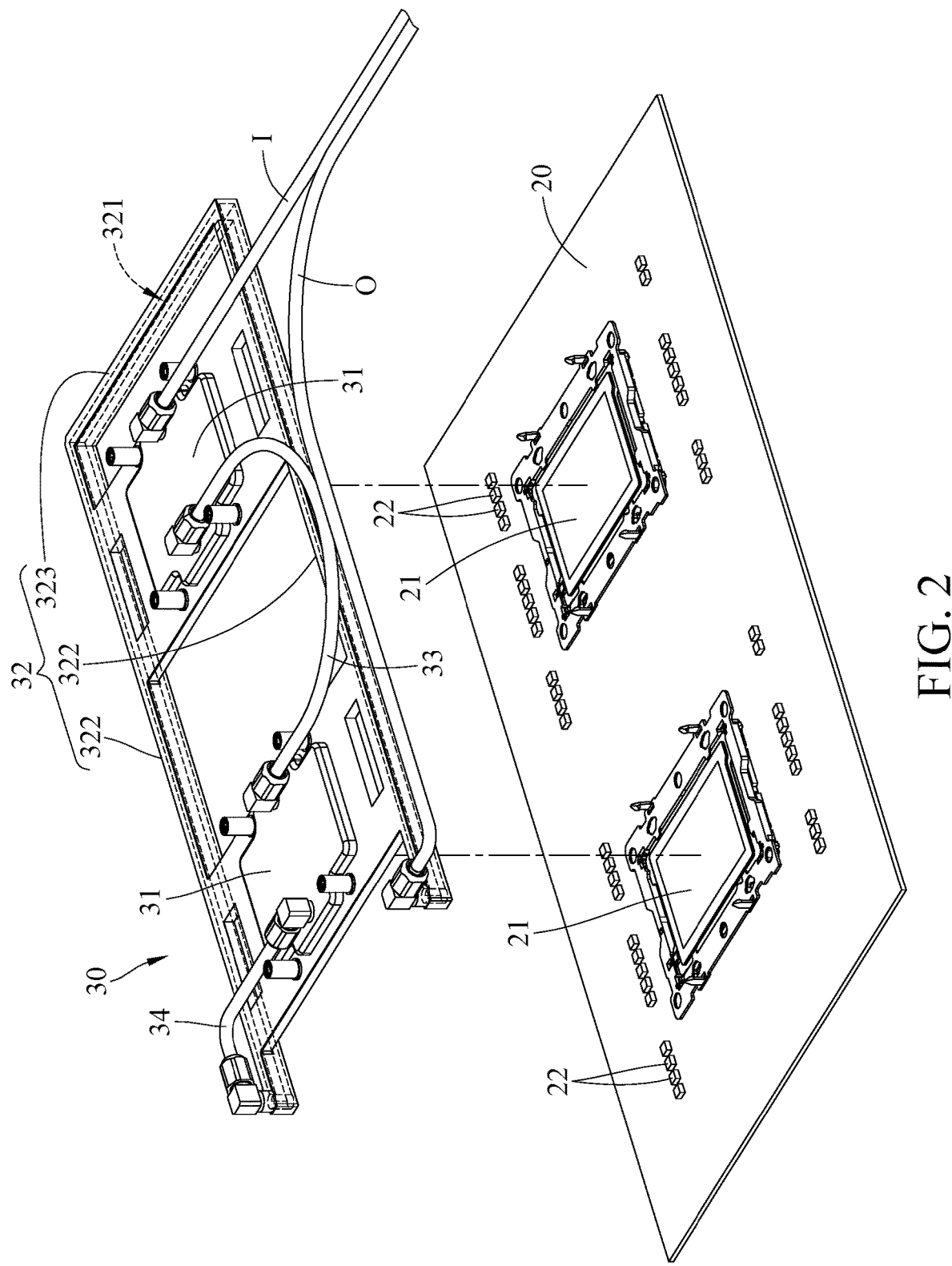
FIG. 2 is an exploded view of a liquid cooling plate and a motherboard in FIG. 1.
Figure 3:
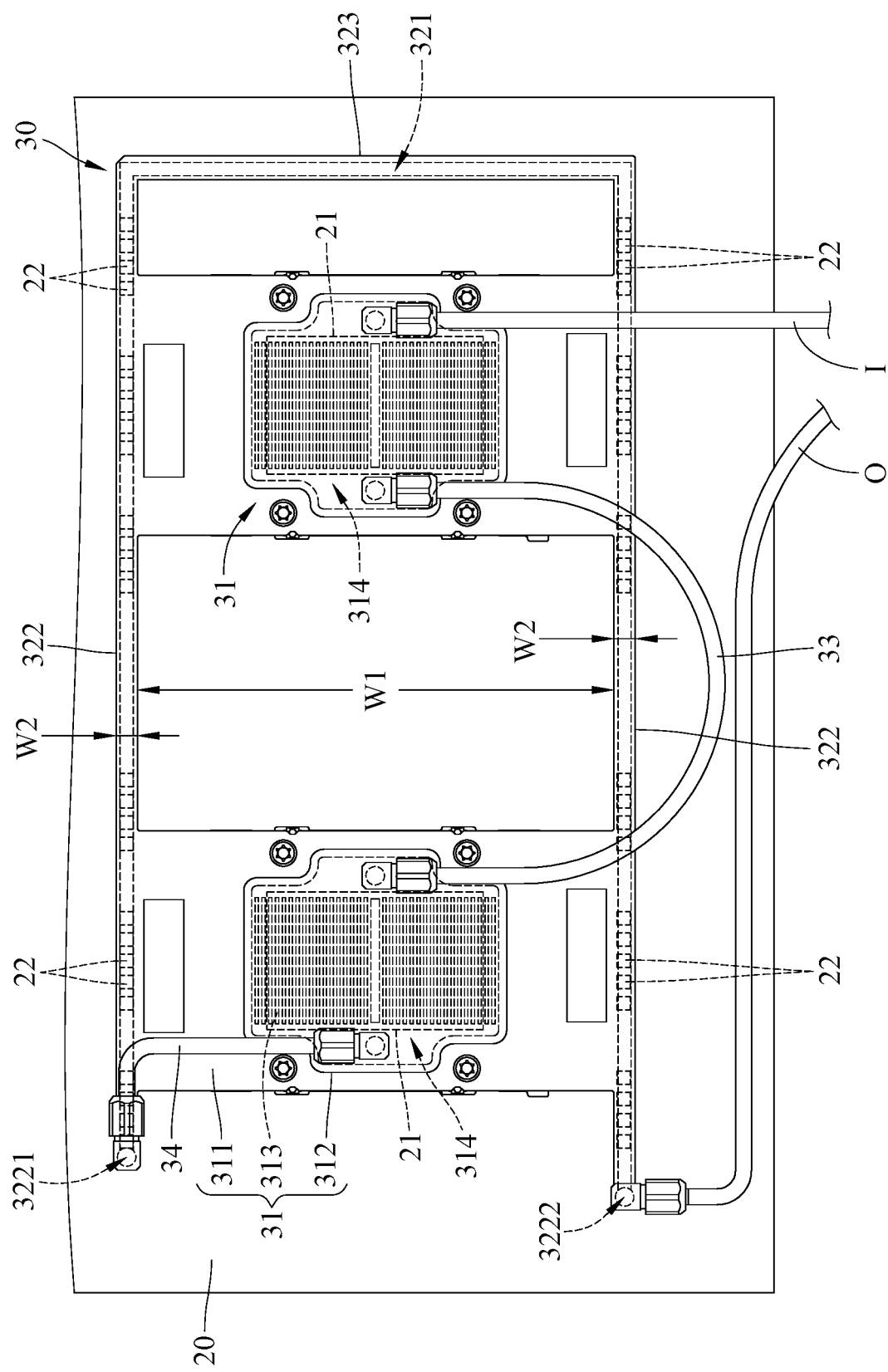
FIG. 3 is a top view of the liquid cooling plate and the motherboard in FIG. 1.

Referring to FIGS. 1 to 3, FIG. 1 is a partial perspective view of a server 1 according to one embodiment of the invention, FIG. 2 is an exploded view of a liquid cooling plate 30 and a motherboard 20 in FIG. 1, and FIG. 3 is a top view of the liquid cooling plate 30 and the motherboard 20 in FIG. 1.

In this embodiment, the server 1 includes a casing 10, a motherboard 20 and a liquid cooling plate 30. In addition, the server 1 may further include other components, such as hard disk drives, fans and a power supply. In order to clear show the structure of the liquid cooling plate 30 of the server 1, the aforementioned components are omitted in the figures.

In this embodiment, the casing 10 has an accommodation space 11, and the motherboard 20 is located in the accommodation space 11. The motherboard 20 has a plurality of first heat sources 21 and a plurality of second heat sources 22. Specifically, the quantity of the first heat sources 21 is, for example, two, and the two first heat sources 21 are, for example, CPUs. The quantity of the second heat sources 22 are, for example, 46. The second heat sources 22 are, for example, voltage regulator chips (i.e., VR chips). The second heat sources 22 are located around the two first heat sources 21. For example, some of the second heat sources 22 are located at two opposite sides of one of the first heat sources 21, and the others of the second heat sources 22 are located at two opposite sides of the other one of the first heat sources 21.

The liquid cooling plate 30 includes two first heat dissipation parts 31 and a second heat dissipation part 32. The two first heat dissipation parts 31 are respectively in thermal contact with the two first heat sources 21 to absorb heat generated by the two first heat sources 21. The two first heat dissipation parts 31 are the same in structure, and thus the following merely introduce one of them in detail. The first heat dissipation part 31 includes a base 311, a cover 312 and a plurality of fins 313. The cover 312 is disposed on the base 311, and the cover 312 and the base 311 together form a fluid chamber 314. The fins 313 are disposed in the fluid chamber 314 and spaced apart from one another.

In this embodiment, the liquid cooling plate 30 may further include a first connection tube 33. Two opposite ends of the first connection tube 33 are respectively connected to the covers 312 of the first heat dissipation parts 31, such that the fluid chambers 314 of the first heat dissipation parts 31 are in fluid communication with each other.

The second heat dissipation part 32 is, for example, U-shaped, and the second heat dissipation part 32 has a fluid channel 321. The second heat dissipation part 32 includes two contact sections 322 and a connection section 323. The contact sections 322 are respectively and integrally connected to two opposite sides of the base 311 of each of the first heat dissipation parts 31, and widths W1 of the first heat dissipation parts 31 are larger than widths W2 of the contact sections 322. The contact sections 322 are in thermal contact with the second heat sources 22 so as to absorb heat generated by the second heat sources 22. Two opposite ends of the connection section 323 are respectively and integrally connected to the contact sections 322, and one of the first heat dissipation parts 31 is located between the other one of the first heat dissipation parts 31 and the connection section 323. Different portions of the fluid channel 321 are respectively located at the contact sections 322 and the connection section 323.

Note that the widths W1 of the first heat dissipation parts 31 are not restricted to being larger than the widths W2 of the contact sections 322; in some other embodiments, the widths of the first heat dissipation parts may be modified to be equal to or smaller than the widths of the contact sections according to the sizes of the heat sources.

In this embodiment, an end of one of the contact sections 322 located farther away from the connection section 323 has a fluid inlet 3221, and an end of the other one of the contact sections 322 located farther away from the connection section 323 has a fluid outlet 3222. The fluid inlet 3221 and the fluid outlet 3222 are respectively located at two opposite ends of the fluid channel 321 of the second heat dissipation part 32. Note that the fluid inlet is not restricted to being located at one end of one of the contact sections located farther away from the connection section, and the fluid outlet is not restricted to being located at one end of the other one of the contact sections located farther away from the connection section. The positions of the fluid inlet and the fluid outlet may be modified according to actual requirements.

In addition, the liquid cooling plate 30 may further include a second connection tube 34. Two opposite ends of the second connection tube 34 are respectively connected to the cover 312 of the first heat dissipation part 31 located farther away from the connection section 323 and the fluid inlet 3221 of one of the contact sections 322, such that the fluid chamber 314 of the first heat dissipation part 31 located closer to the connection section 323 is in fluid communication with the fluid channel 321 through the first connection tube 33, the fluid chamber 314 of the first heat dissipation part 31 located farther away from the connection section 323, the second connection tube 34 and the fluid inlet 3221.

In this embodiment, the cover 312 of the first heat dissipation part 31 located closer to the connection section 323 is configured to be connected to an inlet tube I, and the fluid outlet 3222 of the contact section 322 is configured to be connected to an outlet tube O. The inlet tube I, the liquid cooling plate 30, the outlet tube O, a pump (not shown) and a radiator (not shown) may together form a loop for the circulation of coolant (not shown). For example, the pump can drive the coolant to flow into the fluid chamber 314 of one of the first heat dissipation parts 31 through the inlet tube I, such that the coolant can perform heat exchange with this first heat dissipation part 31 so as to take away the heat generated by one of the first heat sources 21. Then, the coolant flows into the fluid chamber 314 of the other one of the first heat dissipation part 31 through the first connection tube 33, such that the coolant can perform heat exchange with this first heat dissipation part 31 so as to take away the heat generated by the other one of the first heat sources 21. Then, the coolant flows into the fluid channel 321 of the second heat dissipation part 32 through the second connection tube 34, such that the coolant can perform heat exchange with the second heat dissipation part 32 so as to take away the heat generated by the second heat sources 22. Then, the coolant flowing through the fluid channel 321 of the second heat dissipation part 32 flows to the radiator through the outlet tube O so as to be cooled by the radiator. As a result, after the repetition of the aforementioned processes, the liquid cooling plate 30 can effectively perform heat dissipation to the first heat sources 21 and the second heat sources 22 so as to meet the heat dissipation requirements of the first heat sources 21 and the second heat sources 22. Specifically, after the second heat sources 22 are cooled by the liquid cooling plate 30, the temperatures of the second heat sources 22 fall within a range from 55.2° C. to 69.3° C., which are lower than the critical temperature (85° C.) of the second heat sources 22. In addition, a conventional means merely enables the temperatures of the second heat sources 22 to fall within a range from 57.1° C. to 76.1° C., and thus compare to the conventional means, the liquid cooling plate 30 of this embodiment can further reduce the temperatures of the second heat sources 22.

In this embodiment, the fins 313 of the first heat dissipation parts 31 can increase contact areas between the first heat dissipation parts 31 and the coolant so as to increase the efficiency of heat exchange. Note that the fins 313 are optional structures and may be provided or omitted according to the desired efficiency of heat exchange. Moreover, in each of the first heat dissipation parts, the cover and base are not restricted to being made of two pieces; in some other embodiment, the cover and base of the first heat dissipation part may be made of a single piece.

In this embodiment, the contact sections 322 are respectively and integrally connected to two opposite sides of the base 311 of each of the first heat dissipation parts 31, and two opposite ends of the connection section 323 are respectively and integrally connected to the contact sections 322, which facilitates the production and installation of the liquid cooling plate 30, elongates the service life of the liquid cooling plate 30 and enables the liquid cooling plate 30 to be applied in various scenarios.

Note that the contact sections 322 are not restricted to being respectively and integrally connected to two opposite sides of the base 311 of each of the first heat dissipation parts 31, and two opposite ends of the connection section 323 are not restricted to being respectively and integrally connected to the contact sections 322; in some other embodiments, the contact sections may be respectively mounted to two opposite sides of the base of each of the first heat dissipation parts, and two opposite ends of the connection section may be respectively mounted to the contact sections.

Furthermore, since the liquid cooling plate 30 is provided with few connection tubes (e.g., the first connection tube 33 and the second connection tube 34), there are few joints for tubes, which reduces the loss of hydraulic pressure and the risk of leakage and thus improves the safety of the liquid cooling plate 30.

Note that the first connection tube 33 and the second connection tube 34 are optional components; in some other embodiments, the liquid cooling plate may not include the first connection tube and the second connection tube. In such a case, the bases of the first heat dissipation parts may be directly connected to each other, such that the fluid chambers of the first heat dissipation parts may be in fluid communication with each other through interior channels of the bases, and the fluid chamber of one of the first heat dissipation parts may be in fluid communication with the fluid channel of the second heat dissipation part through another interior channel of the base of this first heat dissipation part.

In this embodiment, the first heat dissipation parts 31 and the second heat dissipation part 32 of the liquid cooling plate 30 may be made of metal material, such as aluminum or copper, so as to have higher thermal conductivities for enhancing the heat dissipation efficiency of the liquid cooling plate 30 to the first heat sources 21 and the second heat sources 22.

Note that the motherboard 20 is not restricted to having two first heat sources 21; in some other embodiments, the motherboard may have only one first heat source, and thus the liquid cooling plate may have only one first heat dissipation part. In addition, the second heat sources 22 of the motherboard 20 are not restricted to being located at two opposite sides of the first heat sources 21; in some other embodiments, the second heat sources of the motherboard may be merely located at one side of the first heat sources, and thus the second heat dissipation part of the liquid cooling plate may have only one contact section but without another one contact section and the connection section.

The aforementioned liquid cooling plate 30 is not restricted to being applied in the server 1 and may be modified to be applied in another type of an electronic product.

According to the liquid cooling plate and the server as discussed in the above embodiments, the first heat dissipation parts of the liquid cooling plate are in thermal contact with the first heat sources, the second heat dissipation part of the liquid cooling plate is connected to the first heat dissipation parts and in thermal contact with the second heat sources, and the fluid channel of the second heat dissipation part is in fluid communication with the fluid chambers of the first heat dissipation parts, such that the coolant in the fluid chambers of the first heat dissipation parts can take away the heat generated by the first heat sources, and the coolant in the fluid channel of the second heat dissipation part can take away the heat generated by the second heat sources. As a result, the liquid cooling plate can effectively and efficiently perform heat dissipation to the first heat sources and the second heat sources so as to achieve the heat dissipation requirements of the first heat sources and the second heat sources.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A liquid cooling plate, configured to be in thermal contact with two first heat sources and a plurality of second heat sources, the liquid cooling plate comprising:
    two first heat dissipation parts, each configured to be in thermal contact with a respective one of the two first heat sources, and each of the two first heat dissipation parts has a fluid chamber; and
    a second heat dissipation part, connected to each of the two first heat dissipation parts, the second heat dissipation part comprises:
    a connection portion;
    two contact sections respectively integrally connected to opposite ends of the connection section, the two contact sections are each configured to be in thermal contact with at least a respective one of the plurality of second heat sources; and
    a fluid channel, different portions of the fluid channel are respectively extending through one of the two contact sections, the connection section and another one of the two contact sections; and
    wherein one of the two first heat dissipation parts is located between another one of the two first heat dissipation parts and the connection section, and
    wherein the liquid cooling plate is configured with a coolant flow path that flows sequentially through the fluid chamber of the one of the two first heat dissipation parts, the fluid chamber of the another one of the two first heat dissipation parts, the one of the two contact sections of the fluid channel, the connection section of the fluid channel, and the another one of the two contact sections of the fluid channel.

2. The liquid cooling plate according to claim 1, wherein a width of each of the two first heat dissipation parts is larger than widths of the two contact sections.

3. The liquid cooling plate according to claim 1, further comprising a first connection tube and a second connection tube, wherein the fluid chambers of the two first heat dissipation parts are in fluid communication with each other through the first connection tube, and the fluid chamber of the another one of the two first heat dissipation parts is in fluid communication with the fluid channel via the second connection tube.

4. The liquid cooling plate according to claim 3, wherein an end of the one of the two contact sections located farther away from the connection section has a fluid inlet, an end of the another one of the two contact sections located farther away from the connection section has a fluid outlet, the fluid inlet and the fluid outlet are respectively located at two opposite ends of the fluid channel, and the second connection tube is in fluid communication with the fluid channel through the fluid inlet.

5. The liquid cooling plate according to claim 1, wherein each of the two first heat dissipation parts comprises a base, a cover and a plurality of fins, the base is connected to the second heat dissipation part, the cover is disposed on the base, the cover and the base together form the fluid chamber, and the plurality of fins are disposed in the fluid chamber and spaced apart from one another.

6. A server, comprising:
a casing, having an accommodation space;
a motherboard, located in the accommodation space and having two first heat sources and a plurality of second heat sources; and a liquid cooling plate, comprising:
two first heat dissipation parts, each in thermal contact with a respective one of the two first heat sources, and each of the two first heat dissipation parts having a fluid chamber; and
a second heat dissipation part, connected to each of the two first heat dissipation parts, the second heat dissipation part comprises:
a connection portion;
two contact sections respectively integrally connected to opposite ends of the connection section, the two contact sections are each configured to be in thermal contact with at least a respective one of the plurality of second heat sources; and
a fluid channel, different portions of the fluid channel are respectively extending through one of the two contact sections, the connection section and another one of the two contact sections; and
wherein one of the two first heat dissipation parts is located between another one of the two first heat dissipation parts and the connection section, and
wherein the liquid cooling plate is configured with a coolant flow path that flows sequentially through the fluid chamber of the one of the two first heat dissipation parts, the fluid chamber of the another one of the two first heat dissipation parts, the one of the two contact sections of the fluid channel, the connection section of the fluid channel, and the another one of the two contact sections of the fluid channel.

* * * * *